United States Patent
Kohli et al.

(10) Patent No.: US 8,681,534 B2
(45) Date of Patent: Mar. 25, 2014

(54) DUAL PORT REGISTER FILE MEMORY CELL WITH REDUCED SUSCEPTIBILITY TO NOISE DURING SAME ROW ACCESS

(75) Inventors: Nishu Kohli, Noida (IN); Hiten Advani, New Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 168 days.

(21) Appl. No.: 13/339,580

(22) Filed: Dec. 29, 2011

(65) Prior Publication Data

US 2013/0170288 A1    Jul. 4, 2013

(51) Int. Cl.
*G11C 11/00* (2006.01)
*G11C 8/00* (2006.01)

(52) U.S. Cl.
USPC .............. 365/154; 365/156; 365/230.05

(58) Field of Classification Search
USPC .................. 365/154, 156, 230.05
See application file for complete search history.

(56) References Cited

U.S. PATENT DOCUMENTS

| | | | | |
|---|---|---|---|---|
| 7,193,924 B2 * | 3/2007 | Ramaraju et al. | ........ | 365/230.05 |
| 7,397,723 B2 * | 7/2008 | Lambrache et al. | ..... | 365/230.05 |
| 7,400,523 B2 * | 7/2008 | Houston | ....................... | 365/154 |
| 7,420,836 B1 * | 9/2008 | Kim et al. | ..................... | 365/154 |
| 7,502,277 B2 * | 3/2009 | Wu et al. | ...................... | 365/154 |
| 7,656,702 B2 * | 2/2010 | Wijeratne et al. | ............ | 365/154 |
| 7,656,739 B2 * | 2/2010 | Ham | ........................ | 365/230.05 |
| 7,660,150 B2 * | 2/2010 | Mikan et al. | ................... | 365/154 |
| 7,872,935 B2 * | 1/2011 | Bhatia | ........................... | 365/154 |
| 7,983,071 B2 * | 7/2011 | Houston | ....................... | 365/154 |
| 8,331,133 B2 * | 12/2012 | Galbi | ............................. | 365/154 |
| 8,339,838 B2 * | 12/2012 | Ramaraju | ..................... | 365/154 |
| 2011/0044094 A1 * | 2/2011 | Houston | | |

* cited by examiner

*Primary Examiner* — Trong Phan
(74) *Attorney, Agent, or Firm* — Gardere Wynne Sewell LLP

(57) ABSTRACT

A memory cell is formed by storage latch having a true node and a complement node. The cell includes a write port operable in response to a write signal on a write word line to write data from write bit lines into the latch, and a separate read port operable in response to a read signal on a read word line to read data from the latch to a read bit line. The circuitry of the memory cell is configured to address voltage bounce at the complement node during reading of the memory (where the voltage bounce arises from a simultaneous write to another memory cell in a same row).

12 Claims, 13 Drawing Sheets

DUAL PORT REGISTER FILE MEMORY CELL WITH REDUCED SUSCEPTIBILITY TO NOISE DURING SAME ROW ACCESS

TECHNICAL FIELD

The present invention relates to an integrated memory circuit, and more particularly to a dual port register file (DPRF) memory integrated circuit.

BACKGROUND

Reference is made to FIG. 1 which is a schematic diagram of a standard eight transistor (8T) memory cell 10 known in the art for use in a dual port register file (DPRF) memory. The cell 10 includes two cross-coupled CMOS inverters 12 and 14, each inverter including a series connected p-channel and n-channel transistor pair. The inputs and outputs of the inverters 12 and 14 are coupled to form a latch circuit having a true node 16 and a complement node 18.

The cell 10 further includes two transfer (pass gate) transistors 20 and 22 whose gate terminals are coupled with a write word line node (for the write word line (WWL)) and are controlled by the signal present on the WWL. Transistor 20 is source-drain connected between the true node 16 and a node associated with a true write bit line (WBLT). Transistor 22 is source-drain connected between the complement node 18 and a node associated with a complement write bit line (WBLC). The write bit lines WBLT and WBLC, along with transistors 20 and 22, form a write port for the cell 10 through which data present on the write bit lines WBLT and WBLC, in response to actuation of the write word line WWL, is written to and stored by the true node 16 and a complement node 18 of the latch circuit.

The cell 10 still further includes a transistor 24 whose gate terminal is coupled to the complement node 18 (it being understood that transistor 24 could alternatively be coupled to the true node 16). The transistor 24 is source-drain connected between a reference voltage (in this case a low voltage $V_L$, such as ground) and an intermediate node 26. A transistor 28 is source-drain connected between the intermediate node 26 and a node associated with a read bit line (RBL). The gate terminal of transistor 28 is coupled with a read word line node (for the read word line (RWL)) and is controlled by the signal present on the RWL. The read bit line RBL, along with transistors 24 and 28, form a read port for the cell 10 through which the data value stored by the true node 16 of the latch circuit, in response to actuation of the read word line, is read from the latch circuit and output to the read bit line RBL.

The source terminals of the p-channel transistors in each inverter 12 and 14 are coupled to receive a high source voltage at a high voltage $V_H$ node, while the source terminals of the n-channel transistors in each inverter 12 and 14 are coupled to receive a low source voltage at a low voltage $V_L$ node. The high voltage $V_H$ and the low voltage $V_L$ comprise a power supply set of voltages for the cell 10. Conventionally, the high voltage $V_H$ is a positive voltage (for example, >=0.7V) and the low voltage $V_L$ is a ground voltage (for example, 0V). In an integrated circuit including the cell 10, this power supply set of voltages may be received at pins of the integrated circuit, or may instead be generated on chip by a voltage converter circuit which receives some other set of voltages received from the pins of the chip.

It will thus be recognized by those skilled in the art that the cross-coupled CMOS inverters 12 and 14 along with access transistors 20 and 22 constitute the well known six transistor (6T) static random access memory (SRAM) cell which in a single port SRAM supports storing, reading and writing of data, but in a DPRF memory is only used for storing and writing of data. In a DPRF memory, the transistors 24 and 28 constitute a read port for accessing stored data from the 6T SRAM.

Operation of the cell 10 will now be described.

When in idle mode, the following logic level condition is maintained: WWL=logic low; RWL=logic low; WBLT=logic high; WBLC=logic high; and RBL=logic high.

When operating to write a logic low ("0") into the latch, the following logic level condition is created: WWL=logic high; WBLT=logic low; and WBLC=logic high. The condition on RWL and RBL does not matter.

When operating to write a logic high ("1") into the latch, the following logic level condition is created: WWL=logic high; WBLT=logic high; and WBLC=logic low. The condition on RWL and RBL does not matter.

When operating to read from the latch, the following logic level condition is created: RWL=logic high; and RBL=float at logic high. The read circuitry is to be designed such that the condition on the WWL should not impact the read operation if both WBLT and WBLC are logic high. However, when a write operation is also happening on the same address location (referred to in the art as a concurrent address access), implying that the WWL is at logic high and one of WBLT and WBLC is at logic low, the read operation may not be guaranteed to give any predictable data, and this is an acceptable system constraint. But in a non concurrent address access, depending on the stored data, RBL discharges (if the complement node 18 is logic high and the true node 16 is logic low) or RBL remains at logic high (if the complement node 18 is logic low and the true node 16 is logic high).

Reference is now made to FIG. 2 which is a block diagram of a dual port register file (DPRF) memory array 30. The array 30 includes a plurality of cells 10 arranged in a matrix format. The number of cells 10 included in the array 30 can widely vary depending on the circuit designer's needs. The high voltage VH and the low voltage VL of the power supply set of voltages is applied to the array 30 and distributed over the array in a manner well known to those skilled in the art to the individual ones of the included cells 10 (for application to the source terminals of the p-channel and n-channel transistors as shown in FIG. 1). The block diagram of FIG. 2 further shows the orientation of the bit lines and word lines; with the cells 10 in a same column of the array sharing the ports for the WBLTx (x=1, 2, 3, etc.), WBLCx (x=1, 2, 3, etc.) and RBLx (x=1, 2, 3, etc.), and with the cells 10 in a same row of the array sharing ports for the WWLy (y=1, 2, 3, etc.) and RWLy (y=1, 2, 3, etc.). The array 30 may be arranged, for example, with "w" words and "b" bits, organized as a column mux of "m" having "w/m" rows and "b*m" columns.

A problem arises when a DPRF memory array 30 is organized as column mux>1. For such memory, it is expected to be allowed to perform a write operation on any row for example at a column "i", and to simultaneously perform a read operation on the SAME row, but in another column "j" (again, this is referred to in the art as a concurrent row address access, since only the row address is the same between the read port and the write port, while the column address is different). It should also be noted that, even though the row addresses are same, the complete read port and write port addresses are different. Reference is now made to FIG. 3 which shows two cells 10(i) and 10(j) of same I/O bit, in a same row (these cells need not be adjacent, the illustration adjacency being exemplary only and for ease of showing the problem). FIG. 3 further illustrates the logic level condition on the various ports of the two columns (i and j) in the selected row when the simultaneous write (to the cell in column<i>) and read (to the cell in column<j>) is made on a same row (i.e., a concurrent row address access).

Because WWL=logic high, one of either the true node 16 or complement node 18 in column<j>, depending on which one is currently storing a logic low level ("0") will experience a bounce to a value greater than the logic low level ("0") because of a connection through the actuated pass transistors 20 or 22 to the WBLT or WBLC respectively, as WBLT and WBLC are either driven to logic high or are floating at logic high. This is a well known phenomenon which constrains the stability of the six transistor (6T) SRAM cell.

Considering a case when a logic low ("0") is expected to be read from column<j> (i.e., the complement node 18 is logic high and the true node 16 is at logic low), the bounce due to concurrent row address access, as described above, will happen on true node 16 of column<j>. In this scenario, the RBL of column<j> will discharge as expected, as it was precharged to logic high. The bounce on the true node 16 has no bearing on the success of this read operation, as the complement node 18 does not observe any change in voltage level due to limited bounce on true node 16 and will continue to stay at logic high.

However, for the case when a logic high ("1") is expected to be read from column<j> (i.e., the complement node 18 is logic low and the true node 16 is at logic high), the RBL of column<j> is not expected to discharge, but rather is expected to stay precharged to logic high as it was at the beginning of the cycle. The bounce due to concurrent row address access, as described above, in this case will happen on complement node 18 of column<j> resulting in a voltage higher than 0 on this node. This bounce on complement node 18 of column<j> is a concern. In this scenario the transistor 24, which is expected to be off because of logic low level on its gate resulting in no discharge of RBL, may instead start to operate in a strong sub-threshold region (or in certain corner cases, even turn on) because of a value higher than logic low ("0") present at the complement node 18 due to the bounce. This will lead to an unintended discharge of the RBL, possibly leading to a mistaken reading of a logic low ("0") from the latch circuit instead of a logic high ("1") if the unintended discharge of RBL exceeds the threshold of a next detecting stage (i.e., the discharge of RBL is to an extent that the subsequent stage reads RBL as logic low).

Reference is now made to FIG. 4 which illustrates a timing diagram showing voltage of the read bit line as a function of time during a read operation. As can be seen with reference to line 50 showing bit line discharge, at the point in time 52 for bit line level evaluation, there is a problem with a read of a logic high ("1" referred to as "Read-1") for the fastest read port with noise injected by the write port during the concurrent row address access scenario because of an unintended discharge of RBL to at least a range of uncertainty with respect to making a logic high/low determination by the next stage. Indeed, depending on location of the point in time 52 for bit line level evaluation, the unintended discharge of RBL due to the bounce problem could cause the RBL voltage to fall into the detect as logic low ("0") range. Conversely, as shown with reference to line 54 showing bit line discharge, without noise injected by the write port, as would be the case when the write port is either not accessing any location or is accessing a different row of the DPRF matrix, at the point in time 52 for bit line level evaluation there is no problem with a read of a logic high ("1") because the RBL has not discharged even to the uncertainty range. To complete the analysis, line 56 showing bit line discharge shows that there is no issue with respect to reading a logic low ("0" referred to as "Read-0") for the slowest read port because sufficient RBL discharge occurs under all cases of access by the write port.

To summarize, there is a problem with respect to noise induced on the read port of a DPRF memory cell by its write port in a specific condition of operation (namely, concurrent row address access) because the transistor 24 of the read port begins operating in a strong sub-threshold/weakly on region leading to an unwanted discharge of the read bit line RBL when there is a bounce in the gate voltage of transistor 24. This can potentially lead to an incorrect read operation, and this problem poses a limit on the minimum operating voltage of the read port. It is important to note that the foregoing problem is not solvable by simply changing the timing position for bit line level evaluation (reference 52). For example, moving the point in time 52 for bit line level evaluation back (i.e., closer to the time of read wordline RWL actuation) as shown at 58 may solve the problem with respect to line 50, but will introduce a problem of uncertainty with respect to line 56 corresponding to the case when RBL is expected to discharge and be detected as logic low by next stage. Conversely, moving the point in time 52 for bit line level evaluation forward (i.e., farther from the time of read wordline actuation) will only exacerbate the problem of false ("0") detection when expecting a ("1"), under concurrent row address access scenario.

With the increasing capacity of on chip memory in the latest system on chip (SOC) designs, coupled with increased variability in the latest technology nodes, it is increasingly more likely to experience an occurrence of a memory cell with an incorrect read of a logic high ("1") due to noise injected by the write port and an unintended discharge of the RBL to either the uncertainty region or to the detect logic low ("0") region.

It is also recognized that a DPRF memory can be configured such that the latch and write ports are supplied with a different voltage compared to the read port, in order to save dynamic power. The reason for this is that the latch and write portion of the memory cell is susceptible to a stability and writability issue, while the read port is not. So, in the case of a low power mode of operation, the read port voltage is lowered to as low a value as permissible by the required performance, while simultaneously constraining the latch and write port voltage to a higher value than read port voltage, as determined by memory cell stability and writability. The problem of a read of a logic high ("1") with noise injected by the write port during concurrent row address acccess resulting in an undesired RBL discharge is even more prominent for this dual voltage operating scenario. This is because the voltage bounce discussed above is not reduced by virtue of the latch and write portion being at a higher voltage, but the read port will operate more slowly because of the lower supply voltage on RWL. In context of FIG. 4, this will result in line 56 having lesser slope (i.e. becoming closer to horizontal). Thus, the time of bit line level evaluation has to be further delayed (past point 52) corresponding to line 56 having crossed the uncertain region for a successful read of logic low ("0") from the latch. But this also increases the chance of the write port noise causing a discharge of the RBL when making a read of a logic high ("1") to the extent of the uncertain detection range (or even to the detect logic low ("0") region), as although the unwanted discharge of the RBL should also become slower because of lower RWL level, it may become less slow than the case when RBL has to discharge, because of different worse case mismatch combinations of the read port devices dictating the design for two scenarios. Effectively, this means that the longer the wait for evaluating RBL level for a read logic low ("0"), higher the unwanted RBL discharge level for a read logic high ("1").

One solution to the problem noted above, which is specifically an issue when the DPRF memory array 30 is organized as column mux>1, is to instead organize the DPRF memory array 30 as column mux=1. This solution is not desirable at least because the column mux=1 organization is very restrictive in terms of aspect ratio constraining the physical placement of embedded memories inside the SOC, and also because the column mux=1 increases the susceptibility of the DPRF memory to multiple bit failures per word due to radiation (soft errors), and hence poses a requirement of very costly multiple bit error correction schemes. Single bit error correction schemes are normally deemed sufficient for tackling soft errors for memory array organization of column mux>1, thus making it a preferred configuration over column mux=1, in applications sensitive to radiation errors.

In another solution to the problem noted above, the transistor 24 of the read port is weakened in order to reduce the susceptibility of RBL bounce on the complement node 18 during a read of a logic high ("1"). This solution is not desirable at least because weakening of transistor 24 by increasing transistor length introduces manufacturing complexity as polysilicon pitch has various restrictions in latest technologies. Also weakening of transistor 24 impacts the read current as well as increases variability of read current (if the weakening of transistor 24 is accomplished by transistor width reduction). This leads to significant performance degradation across the voltage range, making this memory cell unsuitable for applications requiring high dynamic operating voltage range along with high performance at higher voltages (e.g., mobile phone chipsets).

There is accordingly a need in the art for a DPRF cell and memory that addresses the deficiencies discussed above while supporting memory organization as a column mux>1.

SUMMARY

In an embodiment, a dual port memory cell comprises: a latch circuit having a true node and a complement node; a true write bit line node; a complement write bit line node; a read bit line node; a write word line node; a read word line node; a true write port circuit coupled between the true write bit line node and true node; a complement write port circuit coupled between the complement write bit line node and complement node; a read port circuit coupled between the read bit line node and the complement node; and means for addressing voltage bounce at the complement node during reading of the memory, said voltage bounce arising in a concurrent row address access scenario.

In an embodiment, a dual port memory cell comprises: a latch circuit having a true node and a complement node; a true write bit line node; a complement write bit line node; a read bit line node; a write word line node; a read word line node; a true write port circuit coupled between the true write bit line node and true node and including a first transistor of a first conductivity type, said first transistor configured to be actuated by a write signal at the write word line node; a complement write port circuit coupled between the complement write bit line node and complement node and including a second transistor of the first conductivity type, said second transistor configured to be actuated by the write signal at the write word line node; and a read port circuit coupled between the read bit line node and the complement node.

The read port circuit includes: a third transistor of second conductivity type opposite to the first conductivity type source-drain coupled between a higher (or lower) voltage reference node and the intermediate node, and having a gate terminal coupled to the complement node of the latch circuit; and a fourth transistor of second conductivity type opposite to the first conductivity type source-drain coupled between the read bit line node and an intermediate node, and having a gate terminal coupled to the read word line node.

In an embodiment, a dual port memory cell comprises: a latch circuit having a true node and a complement node; a true write bit line node; a complement write bit line node; a read bit line node; a write word line node; a read word line node; a true write port circuit coupled between the true write bit line node and true node and including a first transistor configured to be actuated by a write signal at the write word line node; a complement write port circuit coupled between the complement write bit line node and complement node and including a second transistor configured to be actuated by the write signal at the write word line node; and a read port circuit coupled between the read bit line node and the complement node.

The read port circuit includes: a third transistor source-drain coupled between a lower voltage reference node and an intermediate node, and having a gate terminal coupled to the complement node of the latch circuit; a fourth transistor source-drain coupled between the read bit line node and the intermediate node, and having a gate terminal coupled to the read word line node; and a fifth transistor source-drain coupled between a higher voltage reference node and the intermediate node, and having a gate terminal coupled to the true node of the latch circuit; said first, second, third, fourth and fifth transistors are of the same conductivity type.

In an embodiment, a dual port memory cell comprises: a latch circuit having a true node and a complement node; a true write bit line node; a complement write bit line node; a read bit line node; a write word line node; a read word line node; a true write port circuit coupled between the true write bit line node and true node and including a first transistor of first conductivity type configured to be actuated by a write signal at the write word line node; a complement write port circuit coupled between the complement write bit line node and complement node and including a second transistor of first conductivity configured to be actuated by the write signal at the write word line node; and a read port circuit coupled between the read bit line node and the complement node.

The read port includes: a third transistor of first conductivity type source-drain coupled between a lower voltage reference node and an intermediate node, and having a gate terminal coupled to the complement node of the latch circuit; a fourth transistor of first conductivity type source-drain coupled between the read bit line node and the intermediate node, and having a gate terminal coupled to the read word line node; and a fifth transistor of second conductivity type opposite to first conductivity type source-drain coupled between a higher voltage reference node and the intermediate node, and having a gate terminal coupled to the complement node of the latch circuit.

In an embodiment, a memory cell comprises: a storage latch having a true node and a complement node; a write port operable in response to a write signal on a write word line to write data from at least one write bit line into the latch; and a read port operable in response to a read signal on a read word line to read data from the latch to a read bit line; wherein circuitry of the memory cell is configured to address voltage bounce at the complement node during reading of the memory by said read port where said voltage bounce arises from a simultaneous write to another memory cell in a same row (i.e., in a concurrent row address access scenario), and wherein said voltage bounce may produce an unintended change in state of the read bit line.

BRIEF DESCRIPTION OF THE DRAWINGS

For a better understanding of the embodiments, reference will now be made by way of example only to the accompanying figures in which.

DETAILED DESCRIPTION OF THE DRAWINGS

FIGS. 1-4 have been previously described.

Embodiments described herein provide a means for addressing the problem with reading a logic high ("1") with noise injected by the write port during a concurrent row address access scenario resulting in an RBL discharge. One solution is to introduce a memory cell with an inverted impact of the write port on the read port. Specifically, in the current state of the art the write port induces an undesired discharge on read port during a read of a logic high ("1"), but does not impact to any significant degree the operation of the read port during a read of a logic low ("0"). So, a mechanism is provided where the read of logic high ("1") does not get impacted, but a read of logic low ("0") may become slower. With this solution, there are no unrecoverable errors which exist in current state of the art, because delaying the bit line evaluation time will recover the errors related to read of logic low ("0"), without running a risk of RBL discharging to even an uncertainty range during read of logic high ("1"). Another solution is to control the impact of bounce on the complement node 18 which is able to the cause an undesired discharge of RBL.

Figure 1:
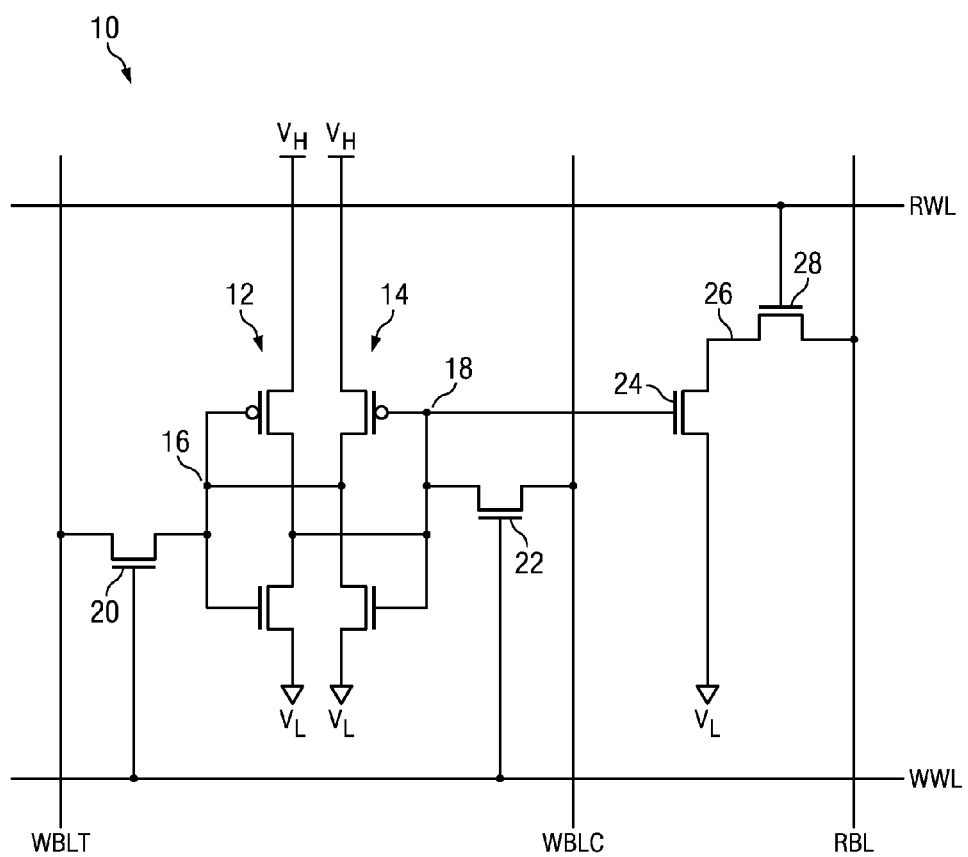
FIG. 1 is a schematic diagram of a standard eight transistor (8T) memory cell for use in a dual port register file (DPRF) memory.

Turning to the first solution, it is observed that in the state of the art the problem with the FIG. 1 implementation occurs on the read port when a logic low ("0") is stored in the complement node 18 (but is not a concern when the complement node 18 stores a logic high ("1")). Instead, a bit cell is proposed which causes the affect to be reversed. In other words, the cell is designed to create a scenario where the bounce on the complement node 18 impacts the read operation when a transition has to occur on RBL (i.e., in this case when RBL has to charge to logic high ("1")), and thus the bounce on complement node 18 does not impact the read operation when no transition has to occur on RBL (i.e., in this case when RBL has to continue to remain at logic low ("0") which is the RBL level at the beginning of read operation).

Figure 5:
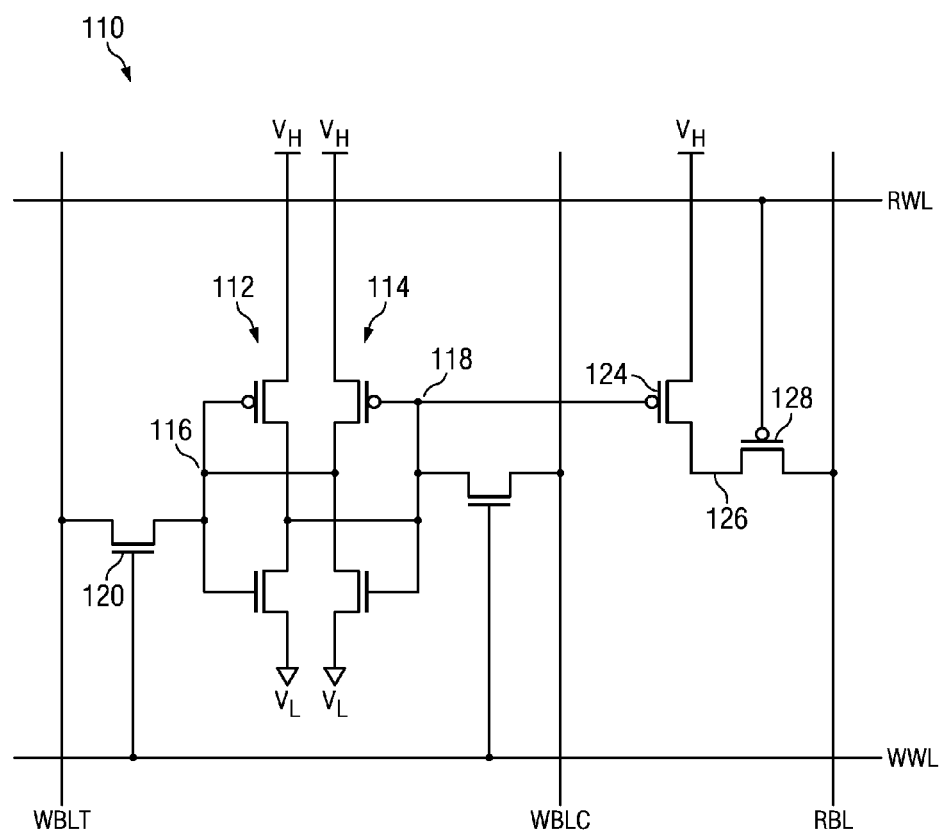
FIG. 5 is a schematic diagram of an eight transistor (8T) memory cell for use in a dual port register file (DPRF) memory.

Reference is made to FIG. 5 which is a schematic diagram of an eight transistor (8T) memory cell for use in a dual port register file (DPRF) memory. The cell 110 includes two cross-coupled CMOS inverters 112 and 114, each inverter including a series connected p-channel and n-channel transistor pair. The inputs and outputs of the inverters 112 and 114 are coupled to form a latch circuit having a true node 116 and a complement node 118.

The cell 110 further includes two transfer (pass gate) transistors 120 and 122 whose gate terminals are coupled with a write word line node and are controlled by the signal present on a write word line (WWL). Transistor 120 is source-drain connected between the true node 116 and a node associated with a true write bit line (WBLT). Transistor 122 is source-drain connected between the complement node 118 and a node associated with a complement write bit line (WBLC). The write bit lines WBLT and WBLC, along with transistors 120 and 122, form a write port for the cell 110 through which data present on the write bit lines WBLT and WBLC, in response to actuation of the write word line WWL, is written to and stored by the true node 116 and a complement node 118 of the latch circuit.

The cell 110 still further includes a transistor 124 whose gate terminal is coupled to the complement node 118 (it being understood that transistor 124 could alternatively be coupled to the true node 116). The transistor 124 is source-drain connected between a reference voltage (in this case a high voltage $V_H$) and an intermediate node 126. A transistor 128 is source-drain connected between the intermediate node 126 and a node associated with a read bit line (RBL). The gate terminal of transistor 128 is coupled with a read word line node and is controlled by the signal present on a read word line (RWL). The read bit line RBL, along with transistors 124 and 128, form a read port for the cell 110 through which data stored by the complement node 118 of the latch circuit, in response to actuation of the read word line, is read from the latch circuit and output to the read bit line RBL.

The source terminals of the p-channel transistors in each inverter 112 and 114 are coupled to receive a high source voltage at a high voltage $V_H$ node, while the source terminals of the n-channel transistors in each inverter 112 and 114 are coupled to receive a low source voltage at a low voltage $V_L$ node. The high voltage $V_H$ and the low voltage $V_L$ comprise a power supply set of voltages for the cell 110. Conventionally, the high voltage $V_H$ is a positive voltage (for example, $>=0.7V$) and the low voltage $V_L$ is a ground voltage (for example, 0V). In an integrated circuit including the cell 110, this power supply set of voltages may be received at pins of the integrated circuit, or may instead be generated on chip by a voltage converter circuit which receives some other set of voltages received from the pins of the chip.

In comparing the circuit of FIG. 5 to the prior art circuit of FIG. 1, it is noted that the circuits share many components and connections in common. Specifically what distinguishes the circuit of FIG. 5 from the prior art circuit of FIG. 1 is that the read port in FIG. 5 is configured using p-channel devices for transistors 124 and 128 while the read port in FIG. 1 is configured using n-channel devices for transistors 24 and 28. This difference not only requires a difference in operation of the cell, to be described below, but also addresses the problem of a read of a logic high ("1") with noise injected by the write port during the concurrent row address access scenario resulting in an unintended RBL discharge.

Operation of the cell 110 will now be described.

When in idle mode, the following logic level condition is maintained: WWL=logic low; RWL=logic high; WBLT=logic high; WBLC=logic high; and RBL=logic low.

When operating to write a logic low ("0") into the latch, the following logic level condition is created: WWL=logic high; WBLT=logic low; and WBLC=logic high. The condition on RWL and RBL does not matter.

When operating to write a logic high ("1") into the latch, the following logic level condition is created: WWL=logic high; WBLT=logic high; and WBLC=logic low. The condition on RWL and RBL does not matter.

When operating to read from the latch, the following logic level condition is created: RWL=logic low; and RBL=float at logic low. Depending on the stored data, RBL charges to logic high (if the complement node 118 is logic low) or RBL remains at logic low (if the complement node 118 is logic high).

Figure 2:
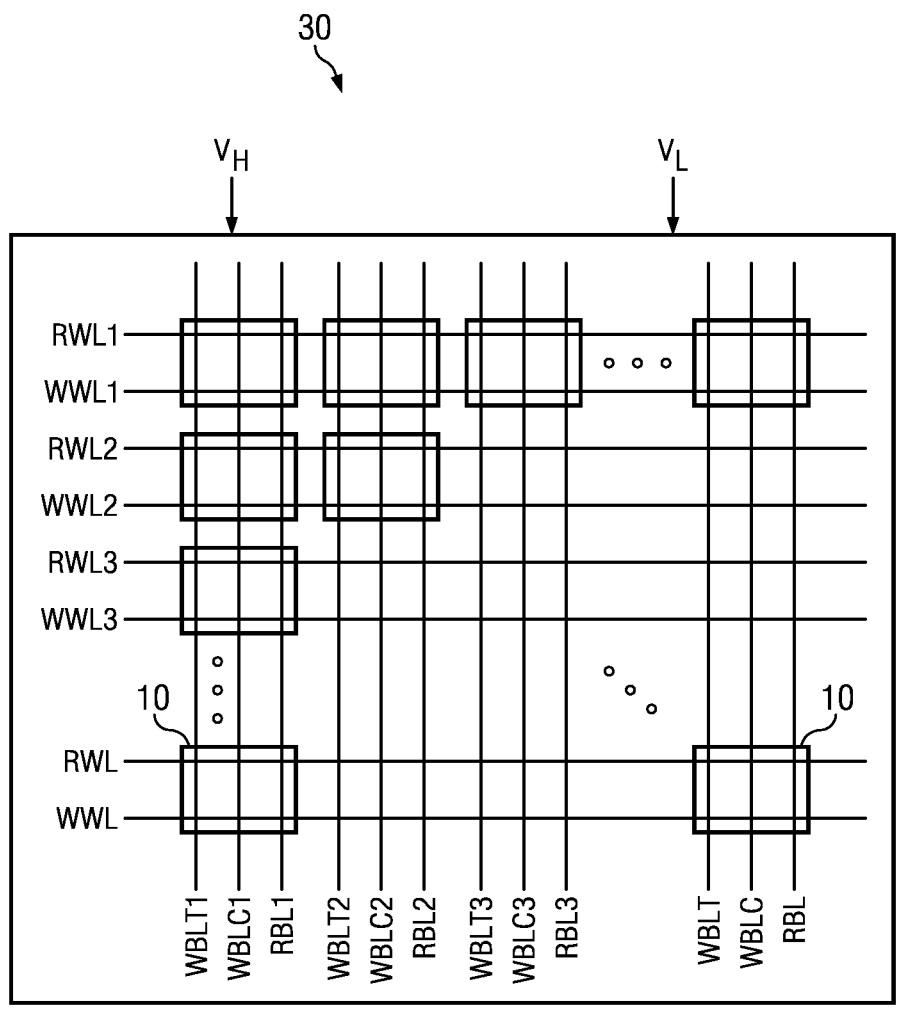
FIG. 2 is a block diagram of a dual port register file (DPRF) memory array.
Figure 3:
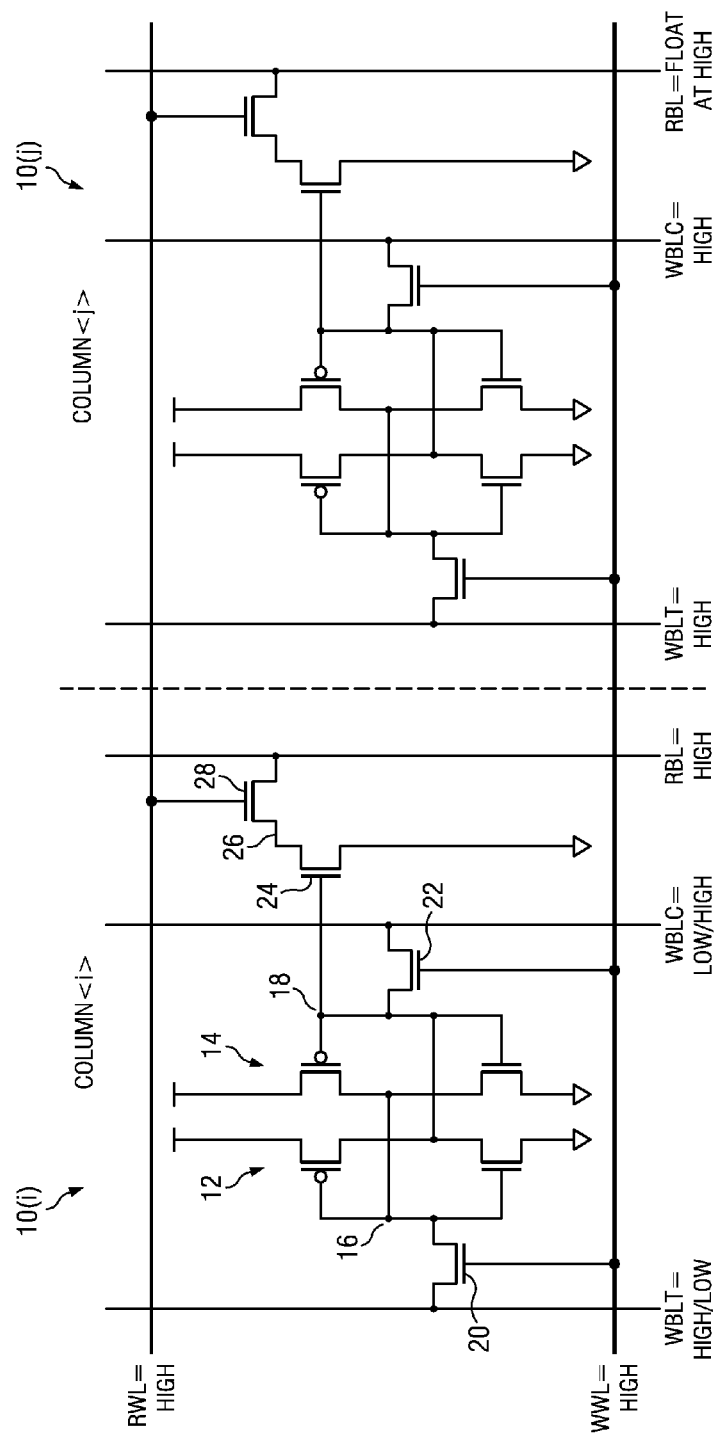
FIG. 3 illustrates two cells in a same row along with conditions with noise injected by a write port.
Figure 4:
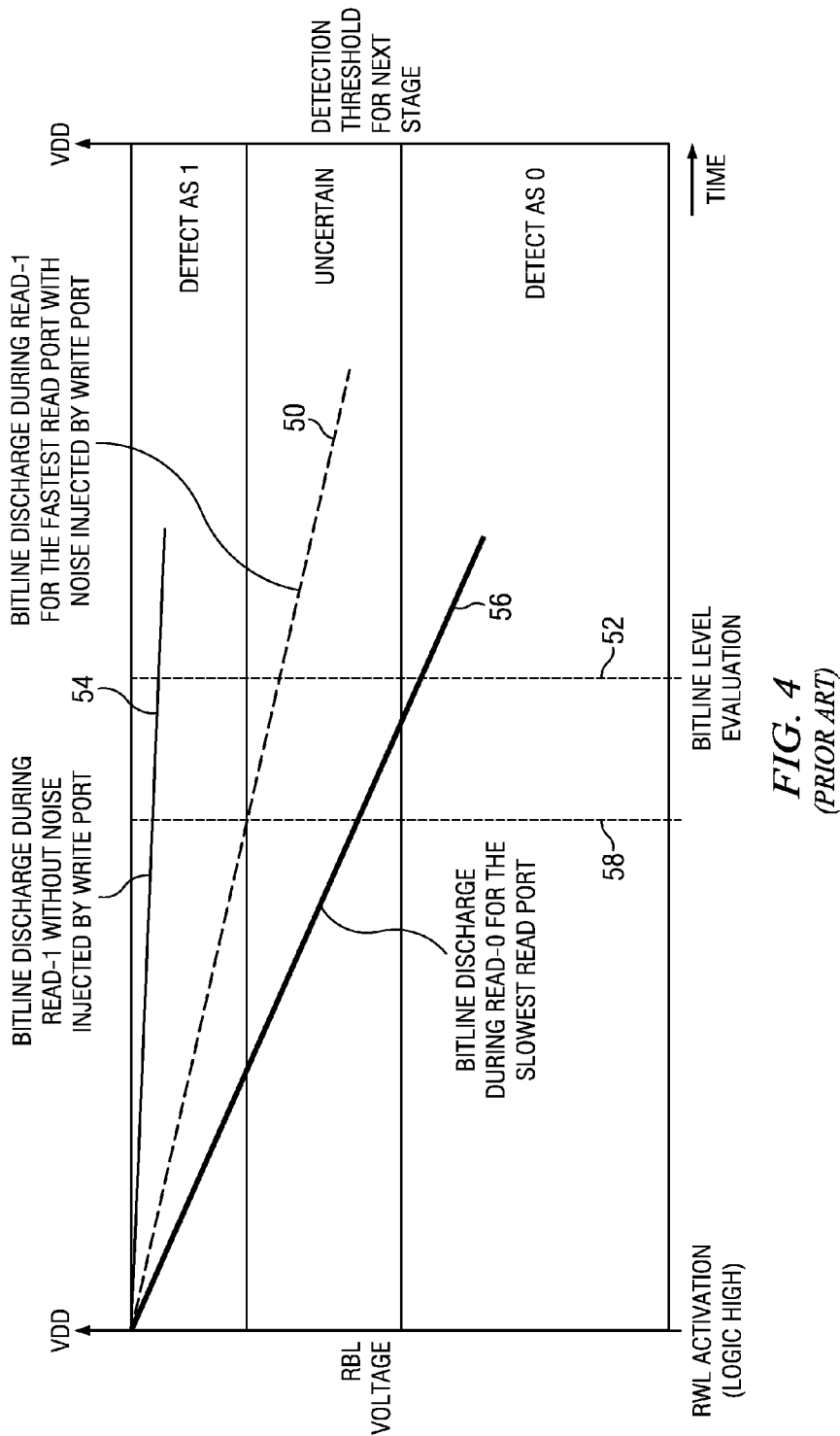
FIG. 4 illustrates a timing diagram showing voltage of the read bit line as a function of time during a read operation.
Figure 6:
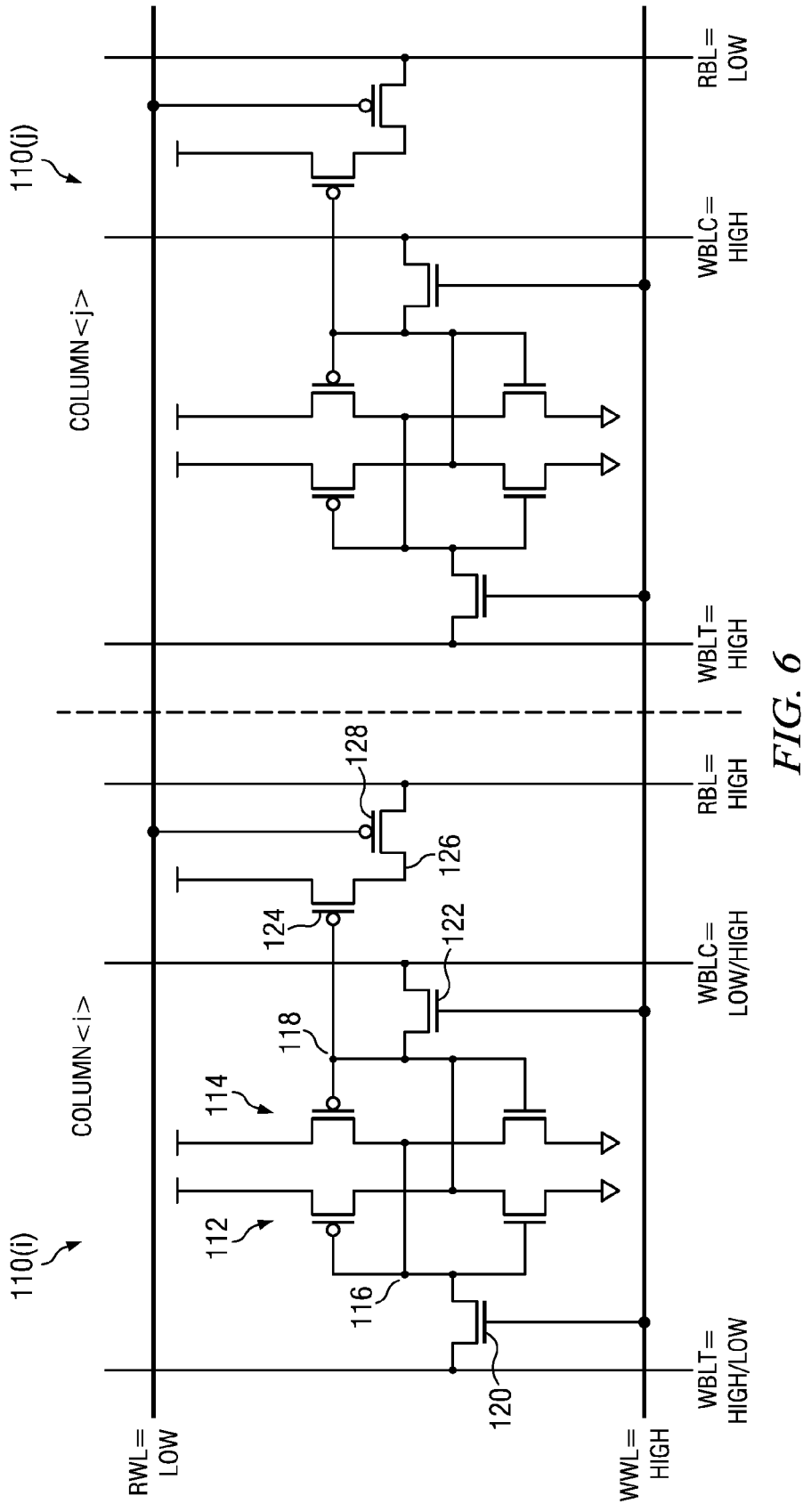
FIG. 6 illustrates two cells from FIG. 5 in a same row along with conditions with noise injected by a write port.

The cells 110 may be used in a dual port register file (DPRF) memory array 30 of the type shown in FIG. 2. The array 30 includes a plurality of cells 110 arranged in a matrix format (like shown with the cells 10 of the prior art). The number of cells 110 included in the array 30 can widely vary depending on the circuit designer's needs. The array 30 may be arranged, for example, with "w" words and "b" bits, organized as a column mux of "m" having "w/m" rows and "b*m" columns. Specifically, it is advantageous to consider the use of a DPRF memory array 30 that is organized as column mux>1. For such memory, it is allowed to perform a write operation on any row, and any column (for example, column "i"), and to simultaneously perform a read operation on the SAME row, but in another column (for example, column "j"). Reference is now made to FIG. 6 which shows two cells 110 in a same row (these cells need not be adjacent, the illustration adjacency being exemplary only and for ease of showing the problem). FIG. 6 further illustrates the logic level condition on the various ports of the two columns (i and j) on same I/O bit in the selected row when the simultaneous write (to the cell in column<i>) and read (to the cell in column<j>) is made on a same row (i.e., in a concurrent row address access scenario).

Because WWL=logic high, the true node 116 or complement node 118 in column<j>, depending on which one is currently storing a logic low level ("0") will experience a bounce to a value greater than the logic low level ("0") because of a connection through the actuated pass transistors 120 or 122 to the WBLT and WBLC respectively, as WBLT and WBLC are either driven to logic high or are floating at logic high. Again, this is a well known phenomenon which constrains the stability of the six transistor (6T) SRAM cell.

Considering a case when a logic high ("1") is expected to be read from column<j> (i.e., the complement node 118 is logic low and the true node 116 is at logic high), the RBL of column<j> will charge, as it was precharged to logic low. The bounce at the true node 116 or complement node 118 in column<j> which is currently storing a logic low level ("0") as described above has little bearing on the success of this read operation other than to slow down the drive of the RBL to logic high level ("1") (due to the fact that gate drive of transistor 124 reduces in response to a non-zero (bounce) value at the complement node 118).

For the case when a logic low ("0") is expected to be read from column<j> (i.e., the complement node 118 is logic high and the true node 116 is at logic high), the RBL of column<j> is not expected to change, but rather is expected to stay at the precharge logic low level as it was at the beginning of the cycle. The bounce at the true node 116 in column<j> which is currently storing a logic low level ("0") as described above has no bearing on the success of this read operation, as the complement node 118 will continue to stay logic high.

In contrast to the operation described above in connection with prior art FIGS. 1, 3 and 4, it will be noted that the read operation performed by the circuit of FIGS. 5 and 6, although still subject to bounce, does not suffer the problem of an unintended RBL voltage level change in a concurrent row address access scenario.

Figure 7:
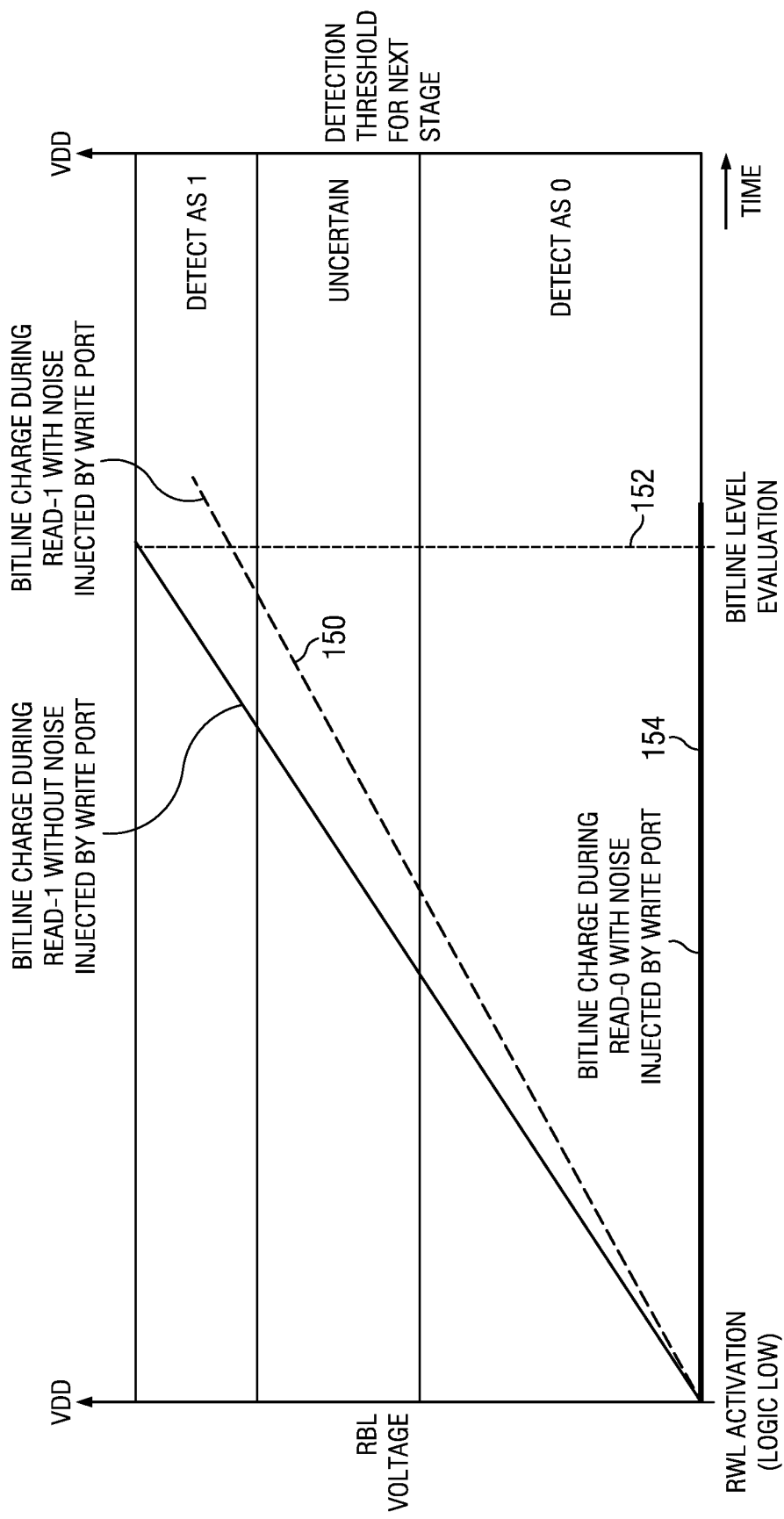
FIG. 7 illustrates a timing diagram showing voltage of the read bit line as a function of time during a read operation.

Reference is now made to FIG. 7 which illustrates a timing diagram showing voltage of the read bit line as a function of time during a read operation. As can be seen with reference to line 150 showing bit line discharge, at the point in time 152 for bit line level evaluation, there is no problem with a read of a logic high ("1" referred to as "Read-1") with noise injected by the write port. The only potential issue concerns the slope of line 150 and the amount of time needed between actuation of the read word line and bit line level evaluation, but this issue is easily addressed by setting of the point in time 152 for bit line level evaluation to ensure RBL charge past the region of uncertainty with respect to making a logic high/low determination by the next stage. This delay in bit line level evaluation time may lead to performance penalty, but this performance penalty is expected to be lower than that expected in prior art solutions and lower the read port operating voltage requirement, higher this improvement, because of higher variability in the prior art solution. With reference to line 154 showing bit line discharge, even in the presence of noise injected by the write port, there is no problem with a read of a logic low ("0" referred to as "Read-0") in the presence of noise injected by the write port because the RBL does not need to change from its precharged logic low level. To complete the analysis, line 156 showing bit line discharge shows that there is no issue with respect to reading a logic high ("1" referred to as "Read-1") without noise injected by the write port (and indeed the slope of the line 156 is greater than the slope of the line 150 because transistor 128 can be fully turned on so as to charge RBL to logic high ("1") more quickly).

Figure 8:
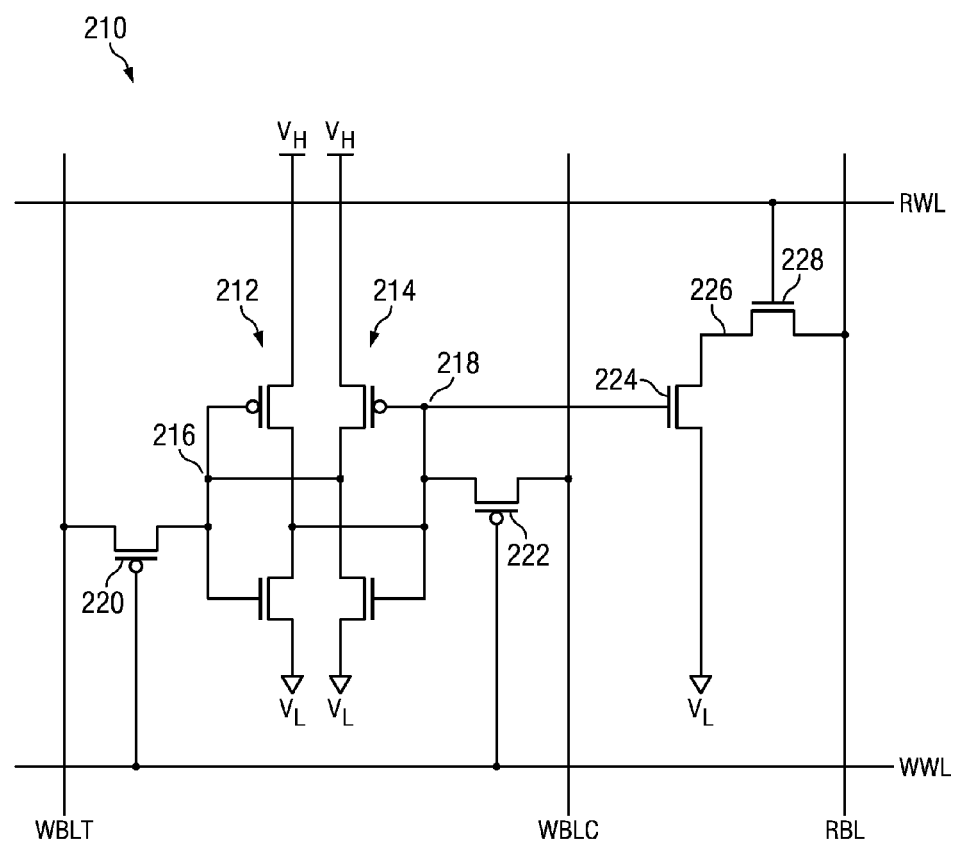
FIG. 8 is a schematic diagram of an eight transistor (8T) memory cell for use in a dual port register file (DPRF) memory.

The effect of the use of p-channel devices for transistors 124 and 128 in the read port is to essentially make the read port complementary to the write port. It will be understood, however, that instead p-channel transistors could be used for the write port (and thus n-channel transistors would continue to be used for the read port). This configuration is shown in FIG. 8 which is a schematic diagram of an eight transistor (8T) memory cell for use in a dual port register file (DPRF) memory. The cell 210 includes two cross-coupled CMOS inverters 212 and 214, each inverter including a series connected p-channel and n-channel transistor pair. The inputs and outputs of the inverters 212 and 214 are coupled to form a latch circuit having a true node 216 and a complement node 218.

The cell 210 further includes two transfer (pass gate) transistors 220 and 222 whose gate terminals are coupled with a write word line node and are controlled by the signal present on a write word line (WWL). Transistor 220 is source-drain connected between the true node 216 and a node associated with a true write bit line (WBLT). Transistor 222 is source-drain connected between the complement node 218 and a node associated with a complement write bit line (WBLC). The write bit lines WBLT and WBLC, along with transistors 220 and 222, form a write port for the cell 210 through which data present on the write bit lines WBLT and WBLC, in response to actuation of the write word line, is written to and stored by the true node 216 and a complement node 218 of the latch circuit.

The cell 210 still further includes a transistor 224 whose gate terminal is coupled to the complement node 218 (it being understood that transistor 224 could alternatively be coupled to the true node 216). The transistor 224 is source-drain connected between a reference voltage (in this case a low voltage $V_L$, such as ground) and an intermediate node 226. A transistor 228 is source-drain connected between the intermediate node 226 and a node associated with a read bit line (RBL). The gate terminal of transistor 228 is coupled with a read word line node and is controlled by the signal present on a read word line (RWL). The read bit line RBL, along with transistors 224 and 228, form a read port for the cell 210 through which data stored by the complement node 218 of the latch circuit, in response to actuation of the read word line, is read from the latch circuit and output to the read bit line RBL.

The source terminals of the p-channel transistors in each inverter 212 and 214 are coupled to receive a high source voltage at a high voltage $V_H$ node, while the source terminals of the n-channel transistors in each inverter 212 and 214 are coupled to receive a low source voltage at a low voltage $V_L$ node. The high voltage $V_H$ and the low voltage $V_L$ comprise a power supply set of voltages for the cell 210. Conventionally, the high voltage $V_H$ is a positive voltage (for example, >=0.7) and the low voltage $V_L$ is a ground voltage (for example, 0V). In an integrated circuit including the cell 210, this power supply set of voltages may be received at pins of the integrated circuit, or may instead be generated on chip by a voltage converter circuit which receives some other set of voltages received from the pins of the chip.

In comparing the circuit of FIG. 8 to the prior art circuit of FIG. 1, it is noted that the circuits share many components and connections in common. Specifically what distinguishes the circuit of FIG. 8 from the prior art circuit of FIG. 1 is that the write port in FIG. 8 is configured using p-channel devices for transistors 220 and 222 while the write port in FIG. 1 is configured using n-channel devices for transistors 20 and 22. This difference not only requires a difference in operation of the cell, to be described below, but also addresses the problem of a read of a logic high ("1") with noise injected by the write port resulting in an unintended RBL discharge.

Operation of the cell 210 will now be described.

When in idle mode, the following logic level condition is maintained: WWL=logic high; RWL=logic low; WBLT=logic low; WBLC=logic low; and RBL=logic high.

When operating to write a logic low ("0") into the latch, the following logic level condition is created: WWL=logic low; WBLT=logic low; and WBLC=logic high. The condition on RWL and RBL does not matter.

When operating to write a logic high ("1") into the latch, the following logic level condition is created: WWL=logic low; WBLT=logic high; and WBLC=logic low. The condition on RWL and RBL does not matter.

When operating to read from the latch, the following logic level condition is created: RWL=logic high; and RBL=float at logic high. Depending on the stored data, RBL discharges (if the complement node 218 is logic high) or RBL remains at logic high (if the complement node 218 is logic low).

Figure 9:
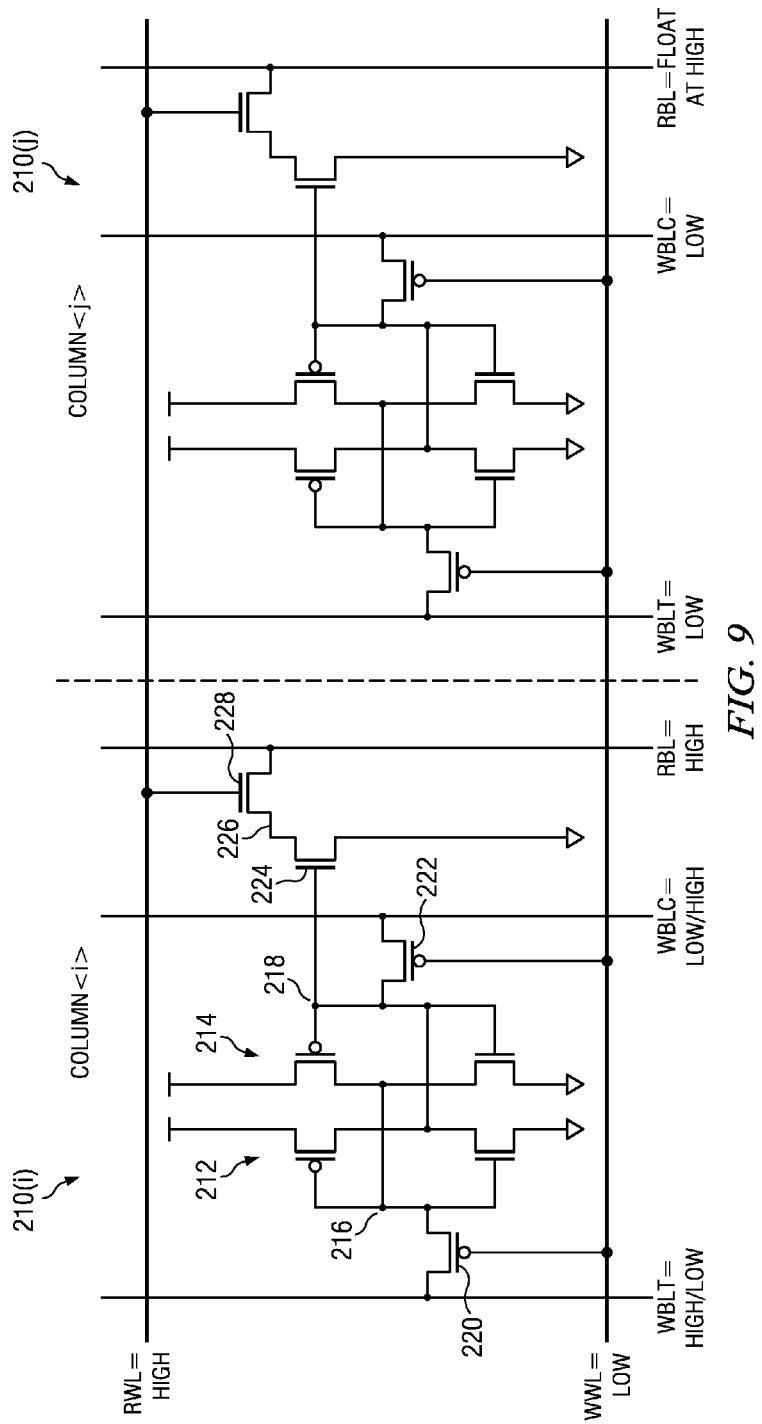
FIG. 9 illustrates two cells from FIG. 8 in a same row along with conditions with noise injected by a write port.

The cells 210 may be used in a dual port register file (DPRF) memory array 30 of the type shown in FIG. 2. The array 30 includes a plurality of cells 210 arranged in a matrix format (like shown with the cells 10 of the prior art). The number of cells 210 included in the array 30 can widely vary depending on the circuit designer's needs. The array 30 may be arranged, for example, with "w" words and "b" bits, organized as a column mux of "m" having "w/m" rows and "b*m" columns. Specifically, it is advantageous to consider the use of a DPRF memory array 30 that is organized as column mux>1. For such memory, it is allowed to perform a write operation on any row, and any column (for example, column "i"), and to simultaneously perform a read operation on the SAME row, but in another column (for example, column "j"). Reference is now made to FIG. 9 which shows two cells 210 in a same row (these cells need not be adjacent, the illustration adjacency being exemplary only and for ease of showing the problem). FIG. 9 further illustrates the logic level condition on the various ports of the two columns (i and j) of same I/O bit, in the selected row when the simultaneous write (to the cell in column<i>) and read (to the cell in column<j>) is made on a same row (i.e., in a concurrent row address scenario).

With WWL=logic low, the true node 216 or complement node 218 in the column<j> depending on which one is currently storing a logic high level ("1") will experience a dip to a value lower than the logic high level ("1") because of a connection through the actuated pass transistors 220 or 222 to the WBLT and WBLC which are driven to logic low or are floating at logic low. Again, this is a well known phenomenon which constrains the stability of the six transistor (6T) SRAM cell.

Considering a case when a logic low ("0") is expected to be read from column<j> (i.e., the complement node 218 is logic high and the true node 216 is at logic low), the RBL of column<j> will discharge, as it was precharged to logic high. The dip on complement node 218 in column<j> which is currently storing a logic level ("1") as described above has no bearing on the success of this read operation, other than to slow down the drive of the RBL to logic low level ("0") (due to the fact that gate drive of transistor 224 reduces in response to a non-fully high (dipped) value at the complement node 218). This issue can be addressed by setting of the point in time for bit line level evaluation to ensure RBL charges past the region of uncertainty with respect to making a logic high/low determination by the next stage. This delay in bit line level evaluation time may lead to a performance penalty, but this performance penalty is expected to be lower than that expected in prior art solutions and lower than the read port operating voltage requirement, higher in this improvement, because of higher variability in the prior art solution.

In the case when a logic high ("1") is expected to be read from column<j> (i.e., the complement node 218 is logic low and the true node 216 is at logic high), the RBL of column<j> is not expected to discharge, but rather is expected to stay precharged to logic high as it was at the beginning of the cycle. The dip on the true node 216 in column<j> which is currently storing a logic high level ("1") as described above is also not a concern in this scenario as the complement node 218 still continues to be at logic low ("0").

In contrast to the operation described above in connection with prior art FIGS. 1, 3 and 4, it will be noted that the read operation performed by the circuit of FIGS. 8 and 9, although still subject to voltage dip, does not suffer the problem of a read of a logic high ("1") with noise injected by the write port resulting in an unintended RBL discharge.

Turning now to the second approach to solving the undesired transition on RBL during concurrent row address access scenario, a circuit is provided which controls the impact of bounce (or dip) on the complement node of the latch and thus reduces the risk of unwanted discharge of RBL beyond the uncertain detection level of the next stage during concurrent row address access scenario while also avoids slowing down of the discharge (or charging) of the RBL.

Figure 10:
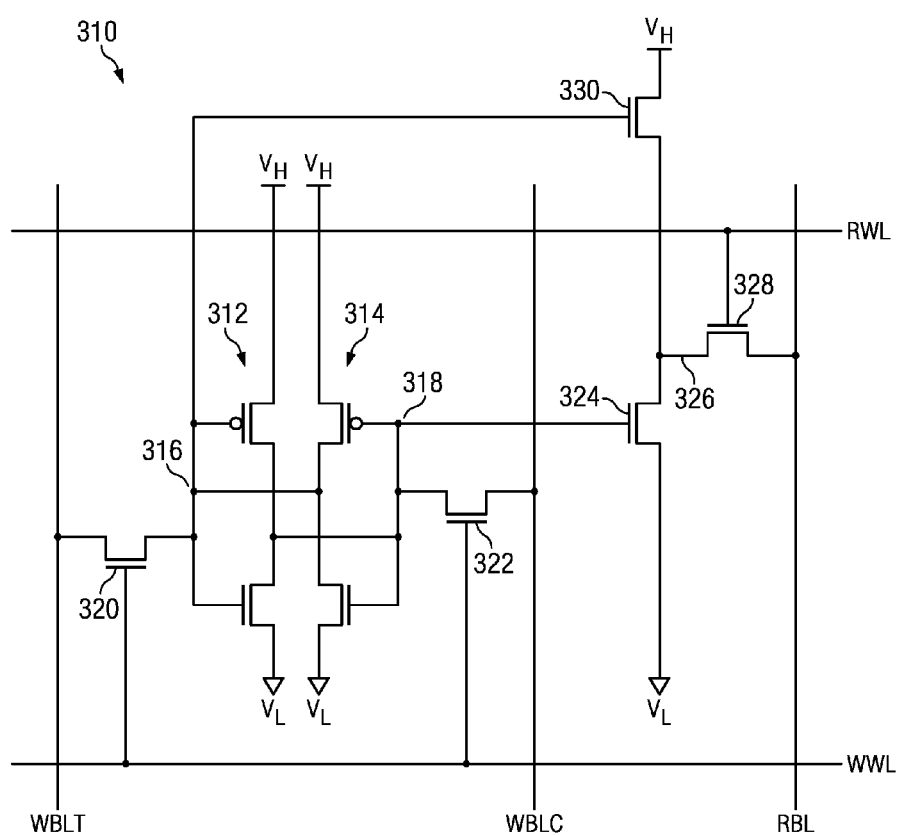
FIG. 10 is a schematic diagram of a nine transistor (9T) memory cell for use in a dual port register file (DPRF) memory.

Reference is made to FIG. 10 which is a schematic diagram of a nine transistor (9T) memory cell 310 for use in a dual port register file (DPRF) memory. The cell 310 includes two cross-coupled CMOS inverters 312 and 314, each inverter including a series connected p-channel and n-channel transistor pair. The inputs and outputs of the inverters 312 and 314 are coupled to form a latch circuit having a true node 316 and a complement node 318.

The cell 310 further includes two transfer (pass gate) transistors 320 and 322 whose gate terminals are coupled with a write word line node and are controlled by the signal present on a write word line (WWL). Transistor 320 is source-drain connected between the true node 316 and a node associated with a true write bit line (WBLT). Transistor 322 is source-drain connected between the complement node 318 and a node associated with a complement write bit line (WBLC). The write bit lines WBLT and WBLC, along with transistors 320 and 322, form a write port for the cell 310 through which data present on the write bit lines WBLT and WBLC, in response to actuation of the write word line, is written to and stored by the true node 316 and a complement node 318 of the latch circuit.

The cell 310 still further includes a transistor 324 whose gate terminal is coupled to the complement node 318 (it being understood that transistor 324 could alternatively be coupled to the true node 316). The transistor 324 is source-drain connected between a reference voltage (in this case a low voltage $V_L$, such as ground) and an intermediate node 326. A transistor 328 is source-drain connected between the intermediate node 326 and a node associated with a read bit line (RBL). The gate terminal of transistor 328 is coupled with a read word line node and is controlled by the signal present on a read word line (RWL). A transistor 330 is source-drain connected between the intermediate node 326 and another reference voltage (in this case a high voltage $V_H$). The gate terminal of transistor 330 is coupled to the true node 316 (it being understood that transistor 324 could alternatively be coupled to the complement node 318 if transistor 324 is coupled to true node 316). Transistor 330 is accordingly source-drain coupled in series with transistor 324 between a first reference voltage (a high voltage $V_H$) and second reference voltage (a low voltage $V_L$, such as ground). The read bit line RBL, along with transistors 324, 328 and 330, form a read port for the cell 310 through which data value stored by the true node 316 of the latch circuit, in response to actuation of the read word line, is read from the latch circuit and output to the read bit line RBL.

The source terminals of the p-channel transistors in each inverter 312 and 314 are coupled to receive a high source voltage at a high voltage $V_H$ node, while the source terminals of the n-channel transistors in each inverter 312 and 314 are coupled to receive a low source voltage at a low voltage $V_L$ node. The high voltage $V_H$ and the low voltage $V_L$ comprise a power supply set of voltages for the cell 310. Conventionally, the high voltage $V_H$ is a positive voltage (for example, $>=0.7V$) and the low voltage $V_L$ is a ground voltage (for example, 0V). In an integrated circuit including the cell 310, this power supply set of voltages may be received at pins of the integrated circuit, or may instead be generated on chip by a voltage converter circuit which receives some other set of voltages received from the pins of the chip.

It will thus be recognized by those skilled in the art that the cross-coupled CMOS inverters 312 and 14 along with access transistors 320 and 322 constitute the well known six transistor (6T) static random access memory (SRAM) cell which supports the writing of data and the storing of data. The transistors 324, 328 and 330 constitute a read port for accessing stored data from the 6T SRAM.

In comparing the circuit of FIG. 10 to the prior art circuit of FIG. 1, it is noted that the circuits share many components and connections in common. Specifically what distinguishes the circuit of FIG. 10 from the prior art circuit of FIG. 1 is that the read port in FIG. 10 is configured to include an additional transistor 330. This difference addresses the problem of undesired RBL discharge during a read of a logic high ("1") due to noise injected by the write port in a concurrent row addresss access scenario.

Operation of the cell 310 will now be described.

When in idle mode, the following logic level condition is maintained: WWL=logic low; RWL=logic low; WBLT=logic high; WBLC=logic high; and RBL=logic high.

When operating to write a logic low ("0") into the latch, the following logic level condition is created: WWL=logic high; WBLT=logic low; and WBLC=logic high. The condition on RWL and RBL does not matter.

When operating to write a logic high ("1") into the latch, the following logic level condition is created: WWL=logic high; WBLT=logic high; and WBLC=logic low. The condition on RWL and RBL does not matter.

When operating to read from the latch, the following logic level condition is created: RWL=logic high; and RBL=float at logic high. Depending on the stored data, RBL discharges (if the complement node 18 is logic high) or RBL remains at logic high (if the complement node 18 is logic low).

Figure 11:
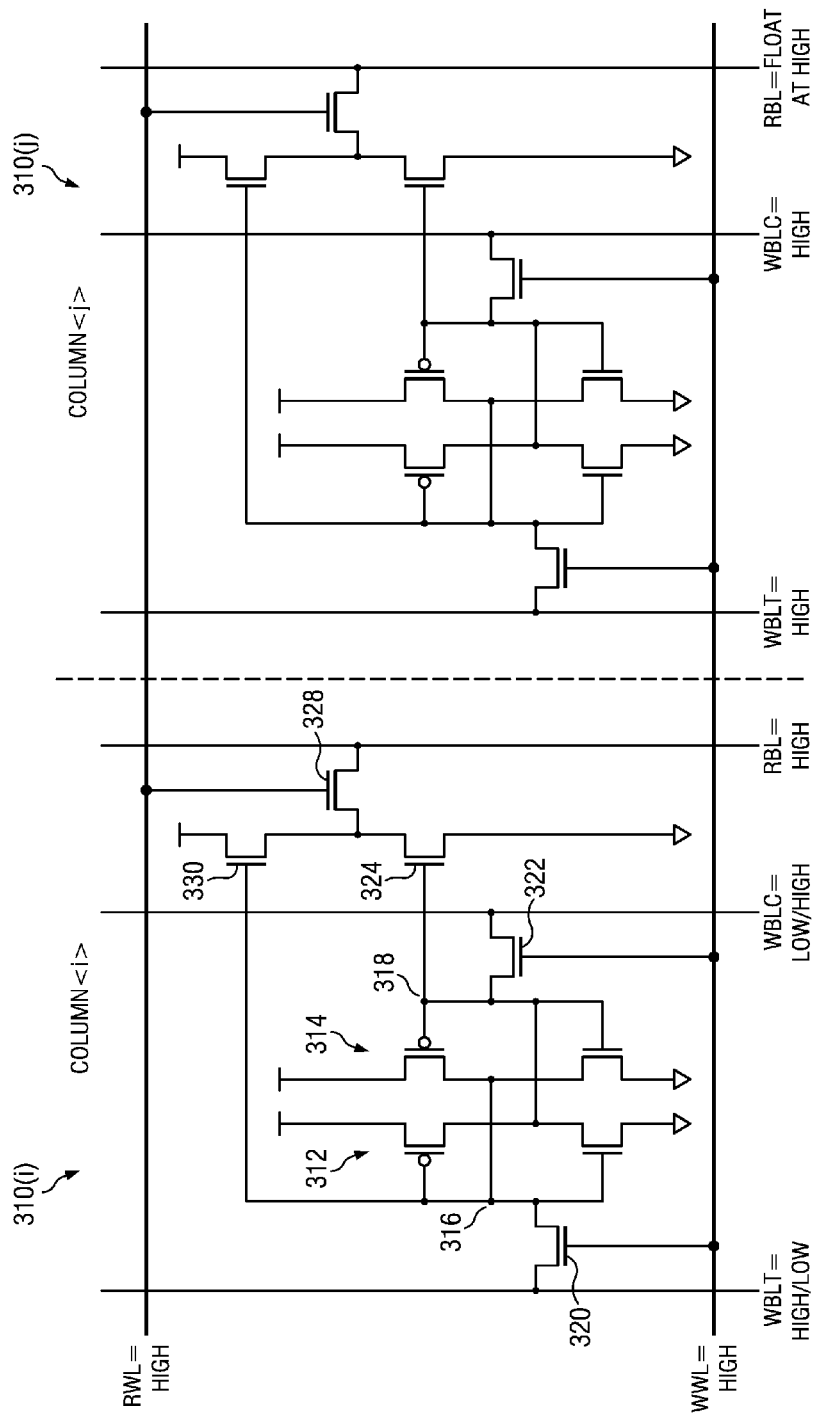
FIG. 11 illustrates two cells from FIG. 10 in a same row along with conditions with noise injected by a write port.

The cells 310 may be used in a dual port register file (DPRF) memory array 30 of the type shown in FIG. 2. The array 30 includes a plurality of cells 310 arranged in an matrix format (like shown with the cells 10 of the prior art). The number of cells 310 included in the array 30 can widely vary depending on the circuit designer's needs. The array 30 may be arranged, for example, with "w" words and "b" bits, organized as a column mux of "m" having "w/m" rows and "b*m" columns. Specifically, it is advantageous to consider the use of a DPRF memory array 30 that is organized as column mux>1. For such memory, it is allowed to perform a write operation on any row, and any column (for example, column "i"), and to simultaneously perform a read operation on the SAME row, but in another column (for example, column "j"). Reference is now made to FIG. 11 which shows two cells 310 in a same row (these cells need not be adjacent, the illustration adjacency being exemplary only and for ease of showing the problem). FIG. 11 further illustrates the logic level condition on the various ports of the two columns (i and j) in same I/O bit in the selected row when the simultaneous write (to the cell in column<i>) and read (from the cell in column<j>) is made on a same row.

Because WWL=logic high, the true node 316 or complement node 318 in column<j> depending on which one is currently storing a logic low level ("0") will experience a bounce to a value greater than the logic low level ("0") because of a connection through the actuated pass transistors 320 or 322 to the WBLT and WBLC which are driven to logic high or are floating at logic high. Again, this is a well known phenomenon which constrains the stability of the six transistor (6T) SRAM cell.

Considering a case when a logic high ("1") is expected to be read from column<j> (i.e., the complement node 318 is logic low and the true node 316 is at logic high), the RBL of column<j> is expected to remain at logic high ("1") level, as it was precharged to logic high at the beginning of the read cycle. The bounce at the complement node 318 in column<j> which is currently storing a logic low level ("0") as described above may turn on transistor 324 to some degree causing current to sink from intermediate node 326, but this current sinking is offset by the activation of the additional transistor 330 (from the logic high signal at the true node 316) which sources current onto intermediate node 326. As a result, there is a reduction in (and perhaps elimination of) the unintended discharge of the RBL.

For the case when a logic low ("0") is expected to be read from column<j> (i.e., the complement node 318 is logic high and the true node 316 is at logic high), the RBL of column<j> is expected to discharge to logic low ("0") as it was pre-charged to logic high level ("1") at the beginning of the cycle. The bounce on the true node 316 in column<j> which is currently storing a logic low level ("0") as described above has no bearing on the success of this read operation, as the complement node 318 will continue to stay at logic high ("1"), causing RBL to discharge.

In contrast to the operation described above in connection with prior art FIGS. 1, 3 and 4, it will be noted that the read operation performed by the circuit of FIGS. 10 and 11, although still subject to bounce, does not suffer the problem of an incorrect read during a logic high ("1") read operation with noise injected by the write port resulting in an unintended RBL discharge.

Figure 12:
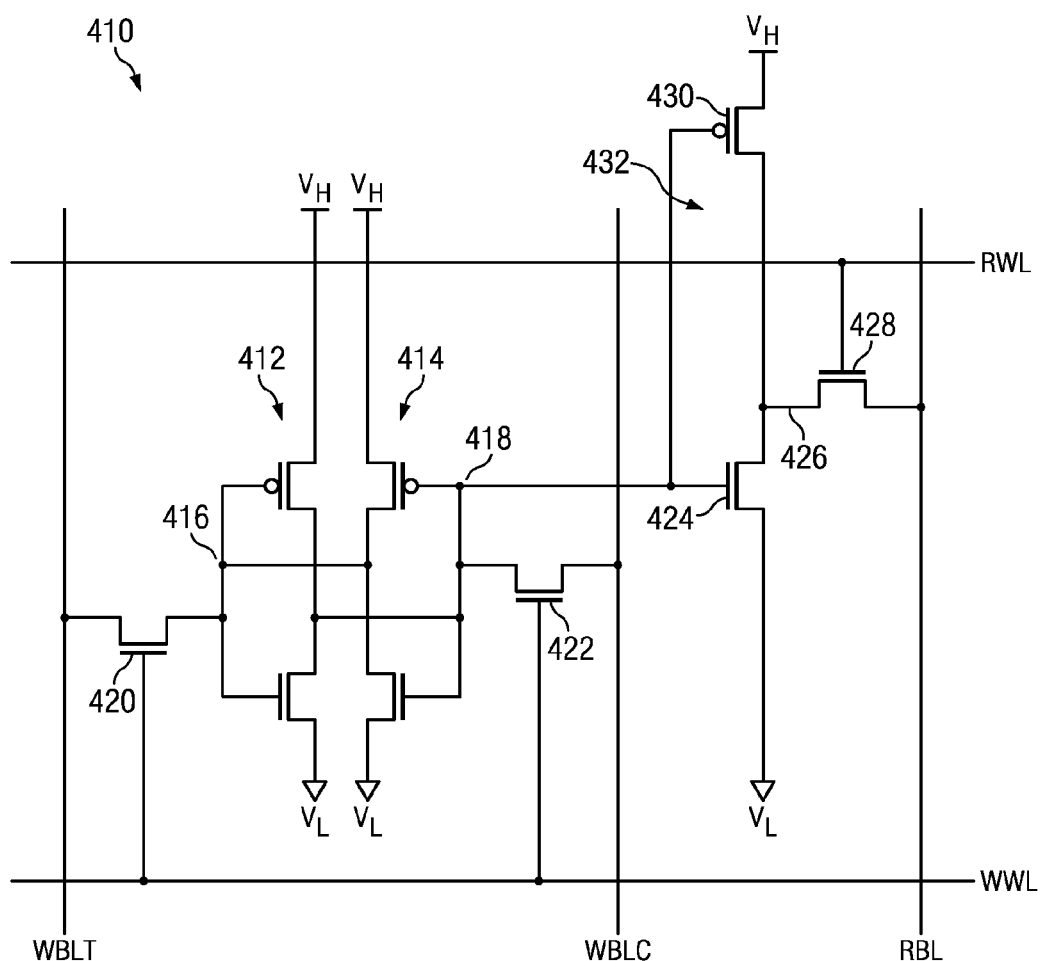
FIG. 12 is a schematic diagram of a nine transistor (9T) memory cell for use in a dual port register file (DPRF) memory.

Reference is made to FIG. 12 which is a schematic diagram of a nine transistor (9T) memory cell 410 for use in a dual port register file (DPRF) memory. The cell 410 includes two cross-coupled CMOS inverters 412 and 414, each inverter including a series connected p-channel and n-channel transistor pair. The inputs and outputs of the inverters 412 and 414 are coupled to form a latch circuit having a true node 416 and a complement node 418.

The cell 410 further includes two transfer (pass gate) transistors 420 and 422 whose gate terminals are coupled with a write word line node and are controlled by the signal present on a write word line (WWL). Transistor 420 is source-drain connected between the true node 416 and a node associated with a true write bit line (WBLT). Transistor 422 is source-drain connected between the complement node 418 and a node associated with a complement write bit line (WBLC). The write bit lines WBLT and WBLC, along with transistors 420 and 422, form a write port for the cell 410 through which data present on the write bit lines WBLT and WBLC, in response to actuation of the write word line, is written to and stored by the true node 416 and a complement node 418 of the latch circuit.

The cell 410 still further includes a CMOS inverter 432 formed from a first transistor 430 that is source-drain coupled in series with a second transistor 424 between a first reference voltage (a high voltage $V_H$) and second reference voltage (a low voltage $V_L$, such as ground). The gates of the first transistor 430 and second transistor 424 are coupled together as well as to the complement node 418 (it being understood that gates could alternatively be coupled to the true node 416). The drain terminals of the first transistor 430 and second transistor 424 are coupled together and to an intermediate node 426. A transistor 428 is source-drain connected between the intermediate node 426 and a node associated with a read bit line (RBL). The gate terminal of transistor 428 is coupled with a read word line node and is controlled by the signal present on a read word line (RWL). The read bit line RBL, along with inverter 432 and transistor 428, form a read port for the cell 410 through which data value stored by the true node 416 of the latch circuit, in response to actuation of the read word line, is read from the latch circuit and output to the read bit line RBL.

The source terminals of the p-channel transistors in each inverter 412 and 414 are coupled to receive a high source voltage at a high voltage $V_H$ node, while the source terminals of the n-channel transistors in each inverter 412 and 414 are coupled to receive a low source voltage at a low voltage $V_L$ node. The high voltage $V_H$ and the low voltage $V_L$ comprise a power supply set of voltages for the cell 410. Conventionally, the high voltage $V_H$ is a positive voltage (for example, >=0.7V) and the low voltage $V_L$ is a ground voltage (for example, 0V). In an integrated circuit including the cell 410, this power supply set of voltages may be received at pins of the integrated circuit, or may instead be generated on chip by a voltage converter circuit which receives some other set of voltages received from the pins of the chip.

It will thus be recognized by those skilled in the art that the cross-coupled CMOS inverters 412 and 414 along with access transistors 420 and 422 constitute the well known six transistor (6T) static random access memory (SRAM) cell which supports the writing of data and the storing of data. The inverter 432 and transistor 428 constitute a read port for accessing stored data from the 6T SRAM.

In comparing the circuit of FIG. 12 to the prior art circuit of FIG. 1, it is noted that the circuits share many components and connections in common. Specifically what distinguishes the circuit of FIG. 12 from the prior art circuit of FIG. 1 is that the read port in FIG. 12 is configured to include an additional transistor 430 coupled with transistor 424 to form the CMOS inverter 432. This difference addresses the problem of a incorrect read during a logic high ("1") read operation with noise injected by the write port in a concurrent row address access scenario resulting in an unintended RBL discharge.

Operation of the cell 410 will now be described.

When in idle mode, the following logic level condition is maintained: WWL=logic low; RWL=logic low; WBLT=logic high; WBLC=logic high; and RBL=logic high.

When operating to write a logic low ("0") into the latch, the following logic level condition is created: WWL=logic high; WBLT=logic low; and WBLC=logic high. The condition on RWL and RBL does not matter.

When operating to write a logic high ("1") into the latch, the following logic level condition is created: WWL=logic high; WBLT=logic high; and WBLC=logic low. The condition on RWL and RBL does not matter.

When operating to read from the latch, the following logic level condition is created: RWL=logic high; and RBL=float at logic high. Depending on the stored data, RBL discharges (if the complement node 418 is logic high) or RBL remains at logic high (if the complement node 418 is logic low).

Figure 13:
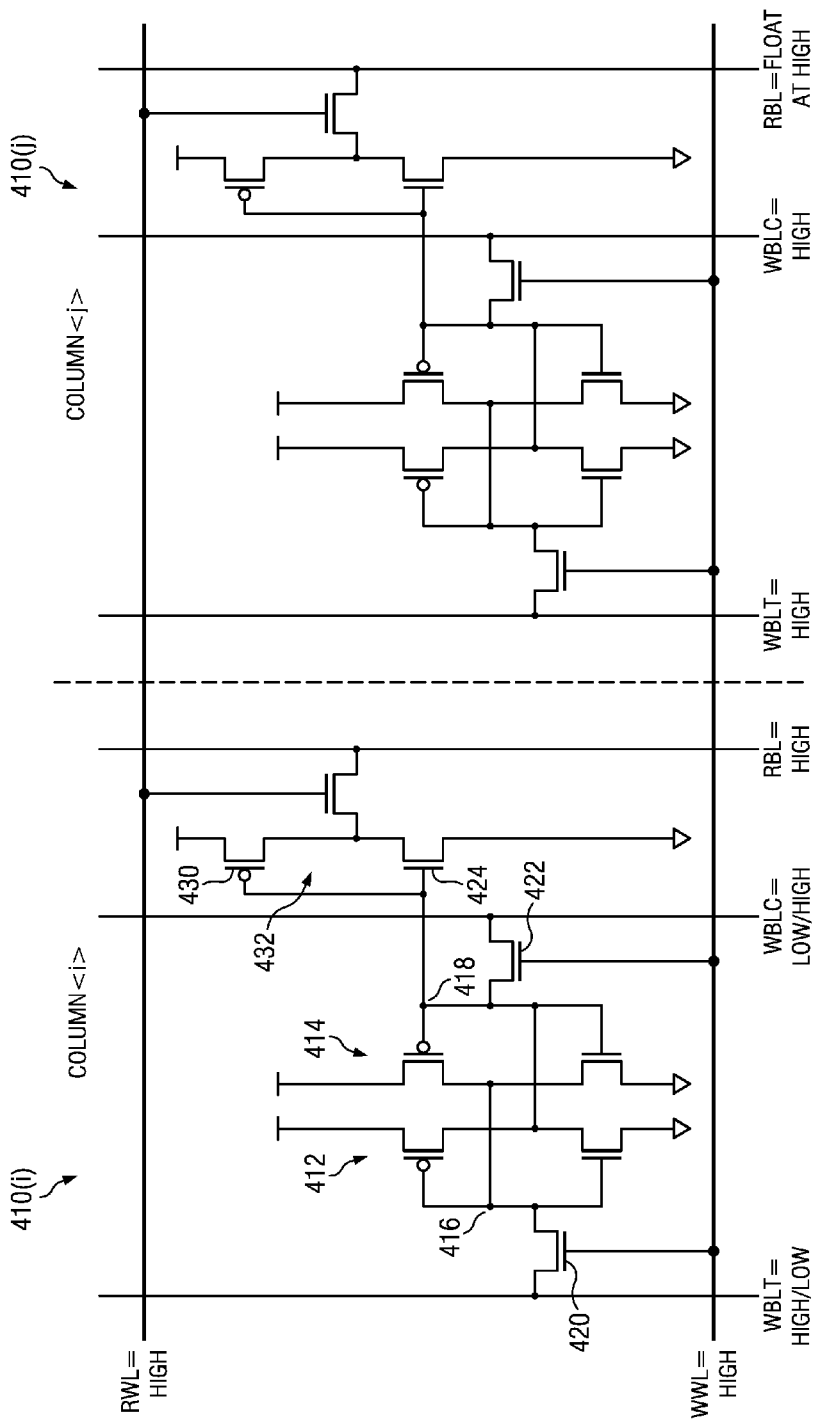
FIG. 13 illustrates two cells from FIG. 12 in a same row along with conditions with noise injected by a write port.

The cells 410 may be used in a dual port register file (DPRF) memory array 30 of the type shown in FIG. 2. The array 30 includes a plurality of cells 410 arranged in a matrix format (like shown with the cells 10 of the prior art). The number of cells 410 included in the array 30 can widely vary depending on the circuit designer's needs. The array 30 may be arranged, for example, with "w" words and "b" bits, organized as a column mux of "m" having "w/m" rows and "b*m" columns. Specifically, it is advantageous to consider the use of a DPRF memory array 30 that is organized as column mux>1. For such memory, it is allowed to perform a write operation on any row, and any column (for example, column "i"), and to simultaneously perform a read operation on the SAME row, but in another column (for example, column "j"). Reference is now made to FIG. 13 which shows two cells 410 in a same row (these cells need not be adjacent, the illustration adjacency being exemplary only and for ease of showing the problem). FIG. 13 further illustrates the logic level condition on the various ports of the two columns (i and j) in same I/O bit in the selected row when the simultaneous write (to the cell in column<i>) and read (to the cell in column<j>) is made on a same row.

Because WWL=logic high, the true node 416 or complement node 418 in each column depending on which one is currently storing a logic low level ("0") will experience a bounce to a value greater than the logic low level ("0") because of a connection through the actuated pass transistors 420 or 422 to the WBLT and WBLC which are driven to logic high or are floating at logic high. Again, this is a well known phenomenon which constrains the stability of the six transistor (6T) SRAM cell.

Considering a case when a logic high ("1") is expected to be read from column<j> (i.e., the complement node 418 is logic low and the true node 416 is at logic high), the RBL of column<j> is expected to remain charged to logic high ("1"), as it was precharged to logic high. The bounce on the complement node 418 in column<j> which is currently storing a logic low level ("0") as described above is addressed by the operation of the CMOS inverter 432. The threshold of the inverter 432 is higher than the threshold of the n-channel transistor 24 (of the prior art implementation shown in FIG. 1) by itself. The higher threshold isolates the intermediate node 426 and transistor 428 from the bounce at complement node 418.

For the case when a logic low ("0") is expected to be read from column<j> (i.e., the complement node 418 is logic high and the true node 416 is at logic high), the RBL of column<j> is expected to discharge, as it was precharged to logic high ("1") at the beginning of the cycle. The bounce on the true node 416 or in column<j> which is currently storing a logic low level ("0") as described above has no bearing on the success of this read operation, as the complement node 418 will continue to stay logic high ("1"), causing RBL to discharge.

In contrast to the operation described above in connection with prior art FIGS. 1, 3 and 4, it will be noted that the read operation performed by the circuit of FIGS. 12 and 13, although still subject to bounce, does not suffer the problem of an incorrect read during a logic high ("1") read operation with noise injected by the write port resulting in an unintended RBL discharge.

Although described in the context of a DPRF memory application, it will be understood that the embodiments and circuitry for addressing bounce at the true/complement node as presented and described above are applicable in other memory cell/array implementations.

The foregoing description has provided by way of exemplary and non-limiting examples a full and informative description of the exemplary embodiments of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A dual port memory cell, comprising:
    a latch circuit having a true node and a complement node;
    a true write bit line node;
    a complement write bit line node;
    a read bit line node;
    a write word line node;
    a read word line node;
    a true write port circuit coupled between the true write bit line node and true node;
    a complement write port circuit coupled between the complement write bit line node and complement node;
    a read port circuit coupled between the read bit line node and the complement node and configured to address a voltage bounce at the complement node during reading of the memory cell, said voltage bounce arising from a simultaneous write to another memory cell in a same row.

2. The memory cell of claim 1, wherein said read port circuit comprises:
    a first transistor source-drain coupled between a lower voltage reference node and an intermediate node, and having a gate terminal coupled to the complement node of the latch circuit;
    a second transistor source-drain coupled between the read bit line node and the intermediate node, and having a gate terminal coupled to the read word line node;
    a third transistor source-drain coupled between a higher voltage reference node and the intermediate node, and having a gate terminal coupled to the true node of the latch circuit.

3. The memory cell of claim 2, wherein the first, second and third transistors are of a same conductivity type as transistors used in the true and complement write port circuits.

4. The memory cell of claim 1, wherein said read port circuit comprises:
    a first transistor source-drain coupled between a lower voltage reference node and an intermediate node, and having a gate terminal coupled to the complement node of the latch circuit;
    a second transistor source-drain coupled between the read bit line node and the intermediate node, and having a gate terminal coupled to the read word line node; and
    a third transistor source-drain coupled between a higher voltage reference node and the intermediate node, and having a gate terminal coupled to the complement node of the latch circuit.

5. The memory cell of claim 4, wherein the first and second transistors are of a same conductivity type as transistors used in the true and complement write port circuits, and wherein the third transistor is of an opposite conductivity type.

6. A dual port memory cell, comprising:
    a latch circuit having a true node and a complement node;
    a true write bit line node;
    a complement write bit line node;
    a read bit line node;
    a write word line node;
    a read word line node;
    a true write port circuit coupled between the true write bit line node and true node and including a first transistor configured to be actuated by a write signal at the write word line node;
    a complement write port circuit coupled between the complement write bit line node and complement node and including a second transistor configured to be actuated by the write signal at the write word line node; and
    a read port circuit coupled between the read bit line node and the complement node and including:
        a third transistor source-drain coupled between a lower voltage reference node and an intermediate node, and having a gate terminal coupled to the complement node of the latch circuit;
        a fourth transistor source-drain coupled between the read bit line node and the intermediate node, and having a gate terminal coupled to the read word line node; and a fifth transistor source-drain coupled between a higher voltage reference node and the intermediate node, and having a gate terminal coupled to the true node of the latch circuit.

7. The memory cell of claim 6, wherein the third, fourth and fifth transistors are of a same conductivity type as the first and second transistors.

8. A dual port memory cell, comprising:
a latch circuit having a true node and a complement node;
a true write bit line node;
a complement write bit line node;
a read bit line node;
a write word line node;
a read word line node;
a true write port circuit coupled between the true write bit line node and true node and including a first transistor configured to be actuated by a write signal at the write word line node;
a complement write port circuit coupled between the complement write bit line node and complement node and including a second transistor configured to be actuated by the write signal at the write word line node; and
a read port circuit coupled between the read bit line node and the complement node and including:
a third transistor source-drain coupled between a lower voltage reference node and an intermediate node, and having a gate terminal coupled to the complement node of the latch circuit;
a fourth transistor source-drain coupled between the read bit line node and the intermediate node, and having a gate terminal coupled to the read word line node;
a fifth transistor source-drain coupled between a higher voltage reference node and the intermediate node, and having a gate terminal coupled to the complement node of the latch circuit.

9. The memory cell of claim 8, wherein the third and fourth transistors are of a same conductivity type as the first and second transistors, and the fifth transistor is of an opposite conductivity type.

10. A memory cell, comprising:
a storage latch having a true node and a complement node;
a write port circuit operable in response to a write signal on a write word line to write data from at least one write bit line into the latch; and
a read port circuit operable in response to a read signal on a read word line to read data from the latch to a read bit line;
wherein said read port circuit is configured to address a voltage bounce at the complement node during reading of the memory cell by said read port where said voltage bounce arises from a simultaneous write to another memory cell in a same row, and wherein said voltage bounce would produce an unintended change in state of the read bit line.

11. The memory cell of claim 10, wherein said read port circuit includes a current source actuated by the true node of the storage latch and operable to source current into an intermediary node of a circuit coupling the complement node to the read bit line, the current from said current source operable to counteract a discharge current present at the intermediary node in response to the voltage bounce.

12. The memory cell of claim 10, wherein said read port circuit includes a CMOS inverter circuit having an input coupled to the complementary node of the storage latch and an output coupled to the read bit line through a source-drain path of a transistor actuated by the read word line.

* * * * *